US011485641B2

(12) United States Patent
Yuge

(10) Patent No.: US 11,485,641 B2
(45) Date of Patent: Nov. 1, 2022

(54) PRODUCTION APPARATUS FOR CARBON NANOHORN AGGREGATE

(71) Applicant: NEC CORPORATION, Tokyo (JP)

(72) Inventor: Ryota Yuge, Tokyo (JP)

(73) Assignee: NEC CORPORATION, Tokyo (JP)

( * ) Notice: Subject to any disclaimer, the term of this patent is extended or adjusted under 35 U.S.C. 154(b) by 352 days.

(21) Appl. No.: 16/636,180

(22) PCT Filed: Aug. 4, 2017

(86) PCT No.: PCT/JP2017/028378
§ 371 (c)(1),
(2) Date: Feb. 3, 2020

(87) PCT Pub. No.: WO2019/026275
PCT Pub. Date: Feb. 7, 2019

(65) Prior Publication Data
US 2020/0369525 A1 Nov. 26, 2020

(51) Int. Cl.
C01B 32/18 (2017.01)
B01J 19/12 (2006.01)
(Continued)

(52) U.S. Cl.
CPC .............. C01B 32/18 (2017.08); B01J 19/121 (2013.01); C23C 14/0605 (2013.01);
(Continued)

(58) Field of Classification Search
CPC ....... C01B 32/18; C01B 32/162; C01B 32/15; C01B 32/16; C01B 2202/06;
(Continued)

(56) References Cited

U.S. PATENT DOCUMENTS

| 5,622,567 A | 4/1997 | Kojima et al. |
| 2007/0003468 A1 | 1/2007 | Azami et al. |
| 2012/0202060 A1* | 8/2012 | Yuge .................. H01J 1/304 423/447.2 |

FOREIGN PATENT DOCUMENTS

| JP | 06-172981 A | 6/1994 |
| JP | 07-252645 A | 10/1995 |

(Continued)

OTHER PUBLICATIONS

International Search Report for PCT/JP2017/028378, dated Oct. 10, 2017.

Primary Examiner — Xiuyu Tai
(74) Attorney, Agent, or Firm — Sughrue Mion, PLLC

(57) ABSTRACT

In order to provide an apparatus for industrially producing a fibrous carbon nanohorn aggregate (CNB), the apparatus comprises: a target holding unit holding a carbon target in sheet form containing a metal catalyst such as Fe; a light source irradiating a laser beam on a surface of the carbon target; a movement unit moving one of the target held by the target holding unit and the light source relative to the other to move the irradiation position of the laser beam on the surface of the target; a production chamber configured to irradiate the carbon target with the laser beam in an atmosphere of non-oxidizing gas to produce a product including the fibrous carbon nanohorn aggregate; a collection mechanism collecting carbon vapor evaporated from the target by irradiation of the laser beam to collect nanocarbon including the fibrous carbon nanohorn aggregate; and a control unit controlling an operation of the movement unit or the light source so that the power density of the laser beam irradiated to the surface of the carbon target is substantially constant, and the irradiation position of the laser beam is moved to a region adjacent to a region previously irradiated by the laser beam, an interval being formed therebetween that is equal to (Continued)

or larger than the width of an altered region formed on the periphery of the region irradiated by the laser beam.

8 Claims, 4 Drawing Sheets

(51) Int. Cl.
*C23C 14/06* (2006.01)
*C23C 14/24* (2006.01)

(52) U.S. Cl.
CPC ....... *C23C 14/24* (2013.01); *B01J 2219/0801* (2013.01); *B01J 2219/0879* (2013.01); *B01J 2219/12* (2013.01); *C01P 2004/03* (2013.01); *C01P 2004/04* (2013.01)

(58) Field of Classification Search
CPC ............ C01B 2202/02; C01B 2202/36; C01B 2202/04; B01J 19/121; B01J 2219/0801; B01J 2219/0879; B01J 2219/12; B01J 23/28; B01J 23/70; B01J 23/40; B01J 23/30; B01J 21/18; B01J 35/0013; B01J 23/74; C23C 14/0605; C23C 14/24; C01P 2004/03; C01P 2004/04; C01P 2004/64; C09C 1/48; D01F 9/12; Y10T 428/2918; B82Y 40/00; B82Y 30/00; H01J 1/304; H01J 9/025; H01J 2201/30453; H01J 2201/30469
See application file for complete search history.

(56) References Cited

FOREIGN PATENT DOCUMENTS

| | | |
|---|---|---|
| JP | 2005-350275 A | 12/2005 |
| JP | 4581997 B2 | 11/2010 |
| WO | 2004/096705 A1 | 11/2004 |
| WO | 2016/147909 A1 | 9/2016 |

* cited by examiner

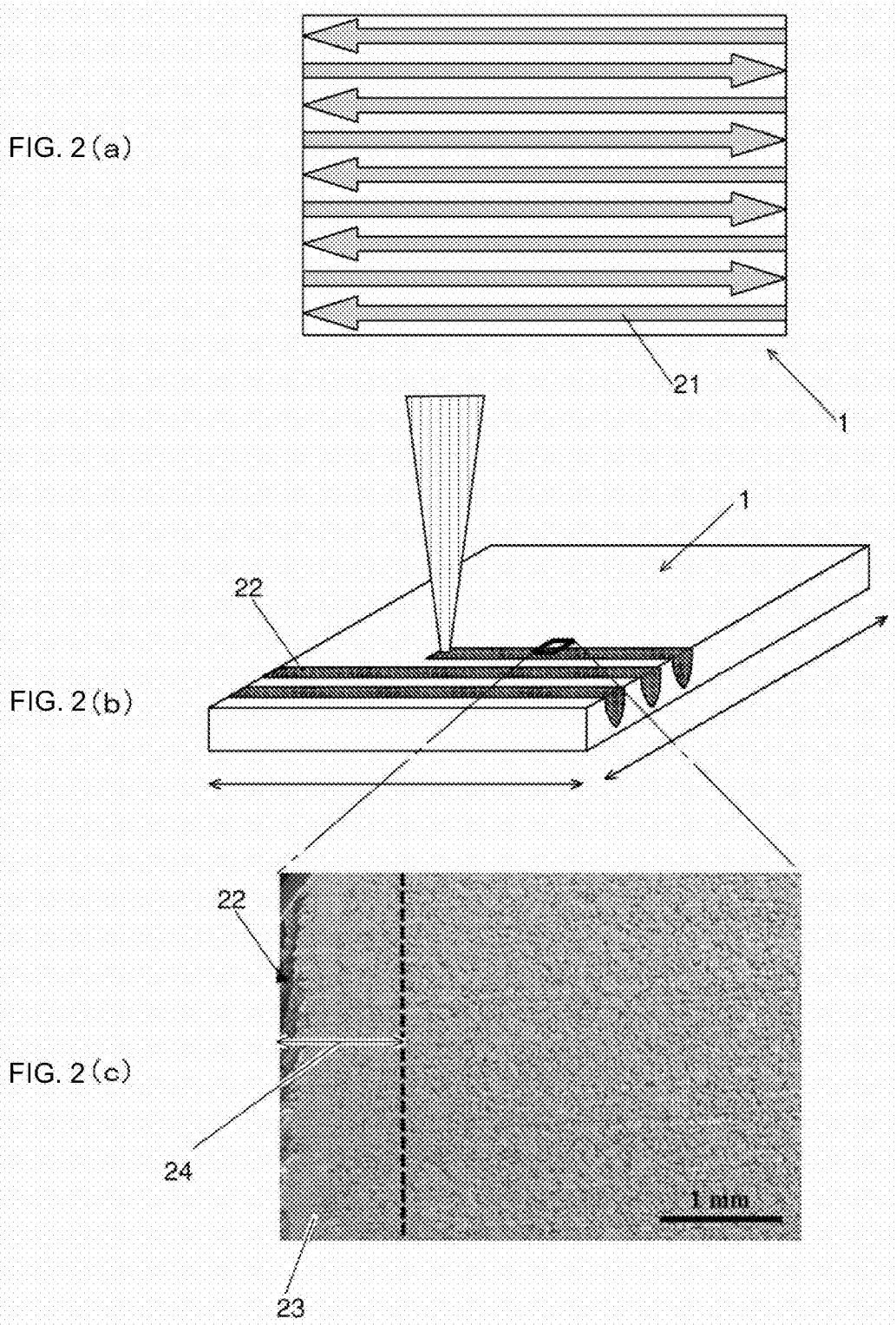

PRODUCTION APPARATUS FOR CARBON NANOHORN AGGREGATE

CROSS REFERENCE TO RELATED APPLICATIONS

This application is a National Stage of International Application No. PCT/JP2017/028378 filed Aug. 4, 2017.

TECHNICAL FIELD

The present invention relates to an apparatus for producing carbon nanohorn aggregates including fibrous carbon nanohorn aggregates.

BACKGROUND ART

Conventionally, carbon materials are utilized as conductive materials, catalyst carriers, adsorbents, isolators, inks, toners, etc., and in recent years, the appearance of nanocarbon materials having nano-size such as carbon nanotubes, carbon nanohorn aggregates, etc. have attracted attention as features as their structures.

The present inventor has found, unlike conventional globular carbon nanohorn aggregates (referred to as CNHs), a fibrous carbon nanohorn aggregates (carbon nanobrush: referred to as CNB) composed of radially assembled carbon nanohorns and having a fiber-like elongated structure (Patent Document 1). CNB is produced by laser ablation, while rotating the carbon target containing a catalyst (Patent Document 1).

Further, an apparatus for producing a conventional CNHs is disclosed in Patent Document 2. The apparatus of Patent Document 2 includes a production chamber configured to irradiate a solid carbon material with a laser beam in an atmosphere of inert gas to produce a product including carbon nanohorns, a graphite component and an amorphous component, and a separation mechanism configured to separate the carbon nanohorns from the graphite component and the amorphous component. Further, it is described that the carbon nanohorn is obtained as an aggregate having diameters of about 50-150 nm (the CNHs herein).

PRIOR-ART LITERATURE

Patent Document

Patent Document 1: WO2016/147909 Publication
Patent Document 2: Japanese Patent No. 4581997

SUMMARY OF INVENTION

Technical Problems

CNB is obtained by laser irradiation of a carbon target containing a catalyst, and both CNB and CNHs are produced. At this time, the proportion of CNB in the product is very small, and the method to produce CNB industrially has not been established.

In the present invention, an object thereof is to provide an apparatus for industrially producing CNB.

Solution to Problem

That is, according to one aspect of the present invention, there is provided a production apparatus for manufacturing carbon nanohorn aggregates including fibrous carbon nanohorn aggregates, the apparatus including:

a target holding unit holding a carbon target in sheet form containing a metal catalyst selected from a single body of Fe, Ni, Co or a mixture of these two or three of them;

a light source irradiating a laser beam on a surface of the carbon target;

a movement unit moving one of the carbon target held by the target holding unit and the light source relative to the other and moving the laser beam irradiation position on the surface of the carbon target;

a production chamber configured to irradiate the carbon target with the laser beam in an atmosphere of non-oxidizing gas to produce a product including the fibrous carbon nanohorn aggregate;

a collection mechanism collecting carbon vapor vaporized from the carbon target by irradiation with the laser beam to collect nanocarbon including the fibrous carbon nanohorn aggregate; and a control unit controlling an operation of the movement unit or the light source so that the power density of the laser beam irradiated to the surface of the carbon target is substantially constant, and the irradiation position of the laser beam is moved to a region adjacent to a region previously irradiated by the laser beam, an interval being formed therebetween that is equal to or larger than the width of an altered region formed on the periphery of the region irradiated by the laser beam.

Effects of Invention

According to one aspect of the present invention, there can be provided an apparatus capable of industrial production of fibrous carbon nanohorn aggregates (CNBs).

BRIEF DESCRIPTION OF DRAWINGS

FIGS. 2(a)-2(c) show FIG. 2(a) a moving direction, FIG. 2(b) a trace of irradiation during laser irradiation, and FIG. 2(c) a modified region after laser irradiation of a sheet-like carbon target according to an embodiment of the present invention;

DESCRIPTION OF EMBODIMENT

Hereinafter, example embodiments of the present invention will be described.

Figure 4:
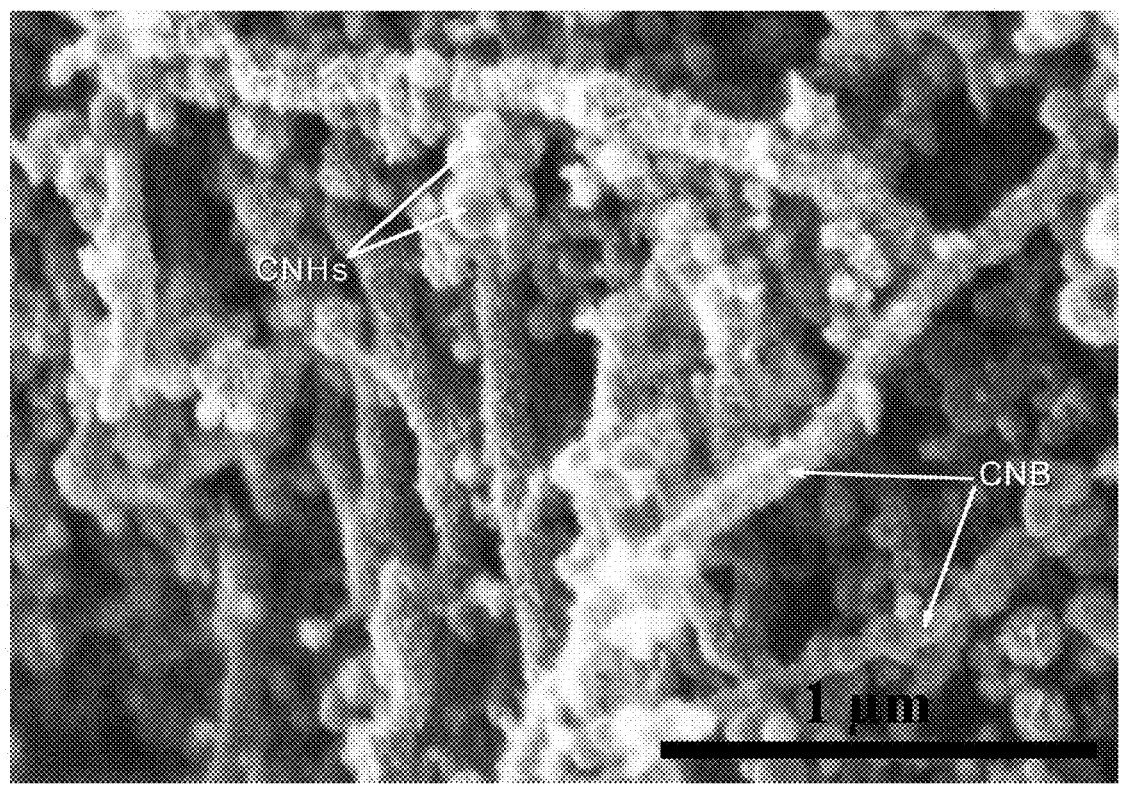
FIG. 4 is a scanning electron micrograph of a carbon nanohorn aggregate produced according to an example embodiment.
Figure 5:
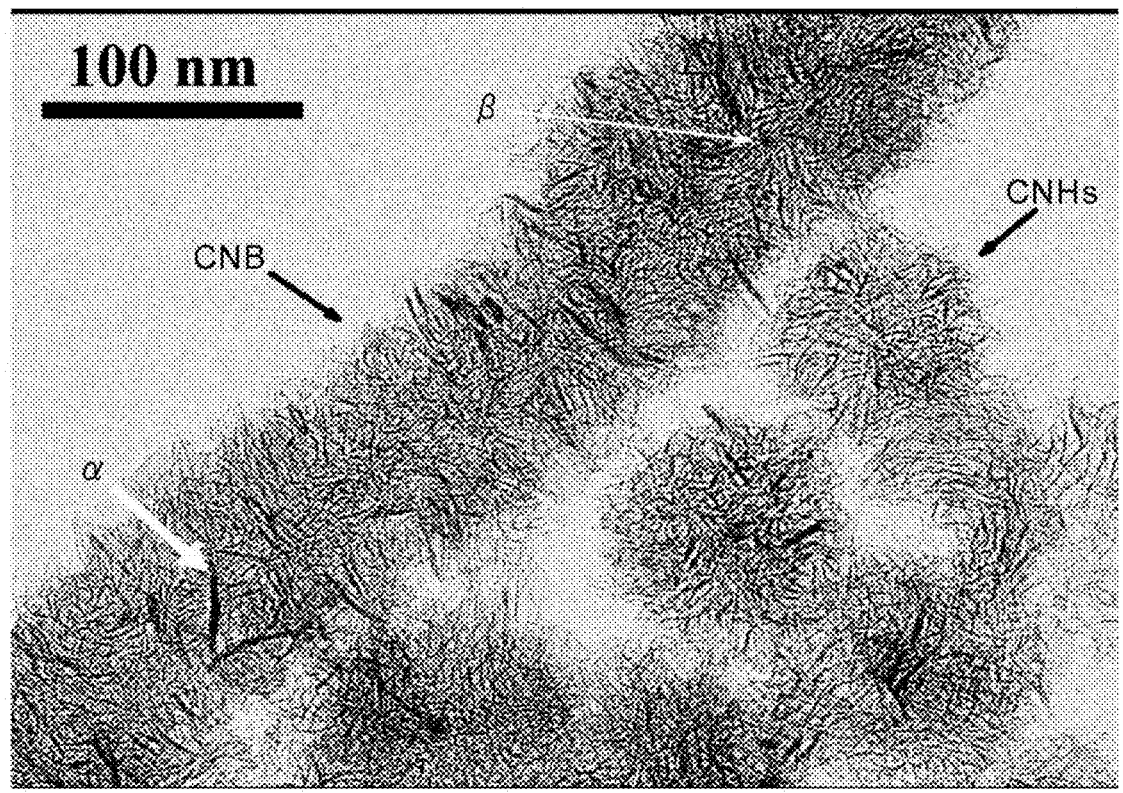
FIG. 5 is a transmission electron micrograph of a fibrous carbon nanohorn aggregate produced according to an example embodiment.

FIG. 4 is a transmission electron microscopic (TEM) image of a fibrous carbon nanohorn aggregate (CNB) and a globular carbon nanohorn (CNHs) fabricated according to an example embodiment of the present invention. FIG. 5 is a scanning electron microscopic (SEM) image. CNB has a structure in which a seed-shaped, a bud-shaped, a dahlia-shaped, a petal dahlia-shaped and/or a petal-shaped (a graphene sheet structure) carbon nanohorn aggregates are one-dimensionally connected. That is, CNB has a structure in which single-walled carbon nanohorns are radially assembled and elongated in a fiber shape. Thus, a fibrous structure contains one or more of these carbon nanohorn aggregates. In addition, carbon nanotubes (CNTs) may be included in the interior of the fibrous carbon nanohorn aggregates. This is due to the formation mechanism of the fibrous carbon nanohorn aggregate according to the present example embodiment as follows.

That is, (1) the catalyst-containing carbon target is rapidly heated by laser irradiation, thereby vaporizing the carbon and catalyst from the target at once and forming a plume by high-density carbon evaporation. (2) At that time, carbon forms carbon droplets of a certain size by collision with each other. (3) In the diffusion process of the carbon droplets, they are cooled gradually to form graphitization of carbon, resulting in the formation of tube-shaped carbon nanohorns. Carbon nanotubes also grow from the catalyst dissolved in the carbon droplets at this time. Then, (4) the radial structure of the carbon nanohorns is connected one-dimensionally with the carbon nanotube as a template, and thereby the fibrous carbon nanohorn aggregates are formed.

The non-transparent particles in FIG. 4 show metals derived from the metal catalyst-containing carbon material used. In the following description, fibrous and globular carbon nanohorn aggregates are combined and referred to simply as carbon nanohorn aggregates.

The diameter of each of the carbon nanohorns (referred to as single-walled carbon nanohorns) including the carbon nanohorn aggregate is approximately 1 nm to 5 nm, and the length is 30 nm to 100 nm. CNB has a diameter of about 30 nm to 200 nm, it is possible to length of about 1 μm to 100 μm. On the other hand, CNHs has approximately uniform size in diameters of about 30 nm to 200 nm.

The CNHs obtained simultaneously is formed in a seed-shaped, a bud-shaped, a dahlia-shaped, a petal dahlia-shaped and/or a petal-shaped one singly or in combination thereof. The seed-shaped one has almost no or no angular projections on its globular surface; the bud-shaped one has slightly angular projections on its globular surface; the dahlia-shaped one is a shape having many angular projections on its globular surface; and the petal-shaped one is a shape having petal-like projections on its globular surface a graphene sheet structure). The petal-dahlia-shaped one has an intermediate structure between the dahlia-shaped one and the petal-shaped one. CNHs is generated in a mixed state with CNBs. Morphology and particle size of the CNHs produced can be adjusted by the type and flow rate of the gases.

Incidentally, CNBs and CNHs can be separated by utilizing a centrifugal separating method or a difference in settling rate after dispersing in solvents. In order to maintain the dispersibility of CNBs, it is preferable to use them as they are without separating from the CNHs. CNB obtained in the present example embodiment is not limited to only the above structure if the single-walled carbon nanohorn is assembled in a fiber shape. Incidentally, the term "fibrous" herein refers to one that can maintain its shape to some extent even by performing the above-described separating operations, and is simply different from one in which a plurality of CNHs is arranged in a series and appear to be fibrous at a glance. Further, in the particle size distribution measurement by the dynamic light scattering measurement, CNB can confirm the peak in the particle size region which clearly differs from the CNHs.

CNBs have high dispersibility compared to other carbon materials having acicular structures, such as carbon fibers and carbon nanotubes. Further, these CNBs and CNHs, since both have a radial structure, there are many contacts at the interface, and they are firmly adsorbed to each other and strongly adsorbed to other material members.

First Example Embodiment

Figure 1:
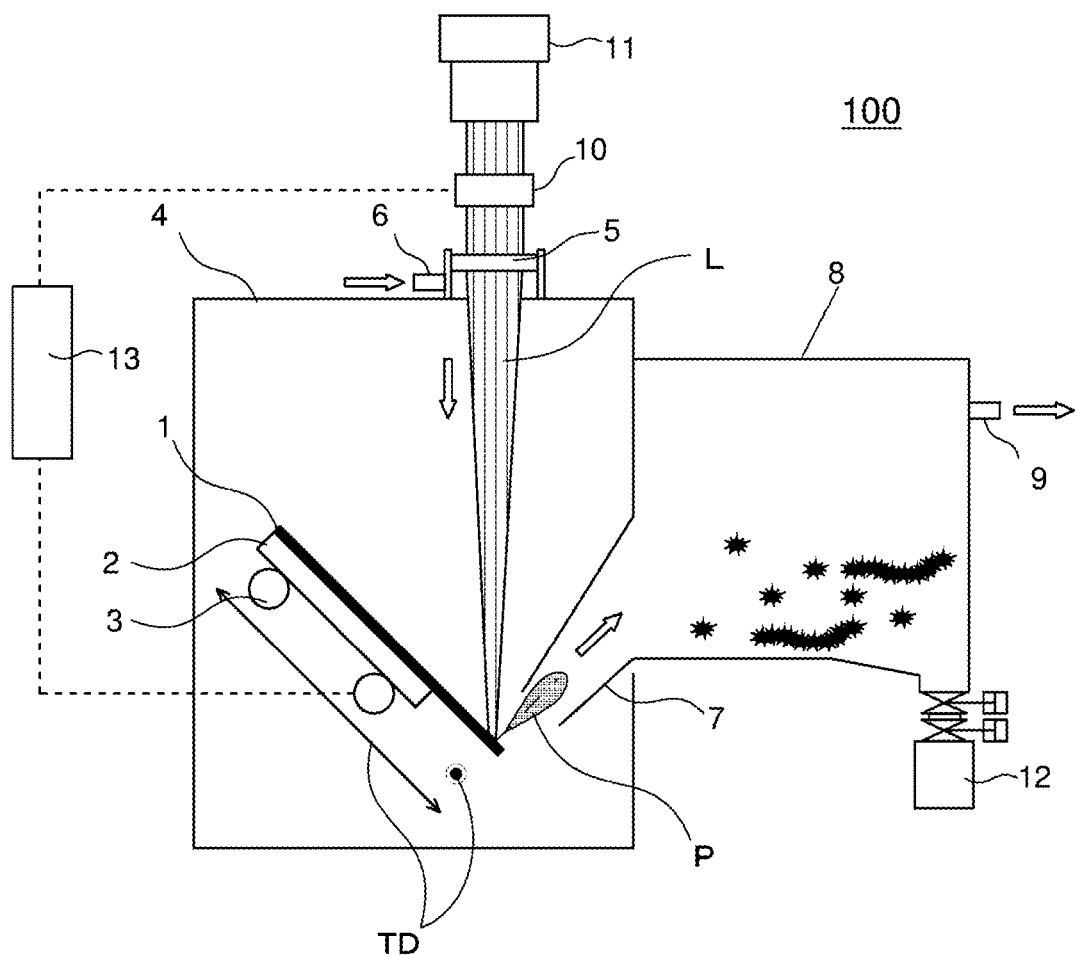
FIG. 1 is a schematic side view of a CNB production apparatus according to an example embodiment of the present invention.

FIG. 1 is a side view showing an example of the configuration of a CNB production apparatus according to the first example embodiment. In this specification, FIG. 1 and the drawings used in the description of other production apparatuses are schematic diagrams, and the size of each component does not necessarily correspond to an actual dimension ratio.

The CNB production apparatus 100 of FIG. 1 includes two chambers, a production chamber 4 and a collection chamber 8. A gas is supplied to the production chamber 4 from a gas inlet 6 so as to be in a non-oxidizing gas atmosphere of nitrogen gas or noble gas such as Ar gas. The laser beam L emitted from the laser beam source 11 passes through the laser focal position adjustment mechanism (the ZnSe plano-convex lens 10 and the ZnSe window 5) and irradiates the surfaces of the targets 1 installed in the production chamber 4.

The target 1 is a carbon target containing a metal catalyst, which is a target for irradiation with the laser beam L. The target 1 is held by a target holding unit 2. The target holding unit 2 is translated in the moving direction TD and moved in the front-back direction of the drawing by the target movement unit 3. As a result, when the movement unit 3 moves, the target 1 installed thereon moves, and the relative position between the irradiation position of the laser beam L and the surface of the target 1 moves.

FIG. 2(a) and FIG. 2(b) are diagrams for explaining the laser irradiation position in the target 1 in more detail. FIG. 2(a) is a top view, and FIG. 2(b) is a perspective view. FIG. 2(c) is a scanning electron microscope image showing the vicinity of the laser irradiation portion.

As shown in FIG. 2(a) and FIG. 2(b), the irradiation position 21 in the target 1 moves in parallel from one end to the other end of the target. In FIG. 2(a), a mode of moving alternately from one end to the other end and from the other end to the one end in the arrow direction is shown, but the present invention is not limited thereto. FIG. 2(b) shows the laser irradiation region 22. In this manner, in the method in which the carbon target is irradiated with the laser beam by the laser ablation and evaporated, the peripheral portion irradiated with the laser beam is also thermally influenced, and the carbonaceous crystal state, the distribution of the catalyst metal, and the like are changed (referred to as an altered region). FIG. 2(c) shows an example of the altered region 23 of the target 1 after the laser irradiation. Up to the dotted line portion of the scanning electron microscope image in FIG. 2(c), it is considered that there is an influence on the target after the irradiation, and in the present invention, this region is defined as the altered region 23. In the production of nano-carbons including carbon nanohorns by conventional laser ablation, it has been known that a method is performed while moving the irradiation position so that the target surface is even during laser irradiation from the viewpoint of maintaining uniform laser irradiation. In terms of suppressing the material cost, it is preferable to use up all of the catalyst-containing carbon target. The inventor had found that CNB does not normally produce if the laser beam is irradiated to the altered region 23 as described above. As a result, laser energy is wasted.

Here, in order to use the target efficiently from an industrial viewpoint, it is conceivable a method of passing the laser beam once close to the region where the laser beam has passed, it is necessary to pass the laser avoiding the altered region. Therefore, in the present example embodiment, the control unit 13 is provided to control the movement of the target 1 in conjunction with the laser power and the laser spot diameter by the laser focal position adjusting mechanism. The control unit 13 controls the moving speed and the parallel moving distance of the moving mechanism so that the laser is irradiated while avoiding the altered region on the target.

Here, "to move the laser irradiation position so that the power density of the laser beam is substantially constant", by the irradiation position of the laser beam (spot) is gradually moved at a constant speed, a substantially constant power density.

At this time, if the moving speed of the laser spot is too slow, the raw material from the target cannot be evaporated and precipitates as a deposit on the target. The precipitates are mainly graphite and carbon nanotubes, and some CNHs is formed, but CNB is not formed. Although the detail is not clear, the slightly evaporated raw material is consumed in the production of CNHs, and it is considered that CNBs are no longer formed. Also, even if the moving speed becomes too fast, it becomes mainly CNHs and no CNB is generated. Therefore, the moving speed is set to be appropriately optimized according to the laser power, the spot diameter of the laser, and the catalyst amount of the catalyst-containing carbon target. For example, as shown in the Examples described below, when using a carbon target containing 1 at. % iron, the generation of CNB has been confirmed in a range of about 5 cm/min to about 35 cm/min at a laser power of 3.2 kW and a spot diameter of 1.5 mm (power density of 181 kW/cm$^2$). In the present invention, the carbon target to be used, the laser power, depending on the spot diameter, the moving speed is preferably 3 cm/min or more, 50 cm/min or less.

Returning to FIG. 1, the transfer pipe 7 communicates with the CNB collection chamber 8. The transfer pipe 7 is provided in the direction in which the plume P is generated when the surface of the target 1 is irradiated with the laser beam L. In FIG. 1, since the laser beam L is irradiated at an angle of about 45° with the surface of the target 1, the plume P is generated in a direction perpendicular to the surface of the target 1. The transfer pipe 7 has a configuration in which a length direction thereof is arranged in a direction perpendicular to the surface of the target 1. By doing so, the vaporized carbon vapor is cooled and the carbon nanohorn aggregate produced is guided from the transfer pipe 7 to the CNB collection chamber 8, and is reliably collected to the CNB collection chamber 8.

The shape of the catalyst-containing carbon material used as the target 1 can be a sheet. By making the shape of the target 1 into a sheet shape and making the irradiation angle and intensity of the laser beam L irradiated on the surface of the target 1 constant, the laser irradiation position can be moved such that the power density of the laser beam on the surface is substantially constant while the fluctuation of the power density on the surface is suppressed. Accordingly, it is possible to stably produce carbon nanohorn aggregates containing CNB. In addition, even when the target 1 is slid in the length direction while keeping the irradiation angle of the laser beam L constant, the laser beam L can be irradiated in the length direction of the target 1 at a constant power density.

The irradiation angle at this time is preferably 30° or more and 60° or less. In the present example embodiment, the irradiation angle is an angle formed by the laser beam L and a perpendicular line to the surface of the target 1 at the irradiation position of the laser beam L.

By setting the irradiation angle to 30° or more, reflection of the laser beam L to be irradiated, that is, generation of the return light can be prevented.

In addition, by setting the irradiation angle to 60° or less, it is possible to suppress the formation of amorphous carbon and improve the ratio of carbon nanohorn aggregates in the product, in particular, the yield of CNB.

The irradiation angle is particularly preferably 45° as shown in FIG. 1. By irradiating at 45°, the proportion of the carbon nanohorn aggregates in the product can be further increased and the yield can be improved.

As described above, in the CNB production apparatus of FIG. 1, since the irradiation position of the laser beam L on the surface of the target 1 can be continuously changed, the carbon nanohorn aggregate can be continuously manufactured. In addition, since it is easy to keep the power density of the laser beam L irradiated onto the surface of the target 1 constant, the carbon nanohorn aggregate can be stably manufactured with high yield.

Further, in the collection chamber 8, a collection container 12 is attached to the bottom wall portion thereof via a valve in order to collect the generated carbon nanohorn aggregate. In addition, a bag filter (not shown) is attached to the collection chamber 8 so that the carbon nanohorn aggregate containing the generated CNB does not go to the exhaust port 9.

Further, the collection chamber 8 has an exhaust port 9 provided at an upper portion of the peripheral wall portion. An exhaust mechanism, for example, a dry pump, for evacuating the inside of the collection chamber 8 is connected to the exhaust port 9.

Next, the operation of the production apparatus shown in FIG. 1 will be described.

In the production chamber 4, when the target 1 is irradiated with the laser beam L and carbon is evaporated in a non-oxidizing gas atmosphere, a product (plume P) containing carbon nanohorn aggregates is produced. At this time, if the inside of the collection chamber 8 is exhausted while introducing the non-oxidizing gas into the production chamber 4 (if the pressure of the collection chamber 8 is lower than the pressure in the production chamber 4), a gas flow through the transfer pipe 7 can be made. Since the end of the transfer pipe 7 in the production chamber 4 is provided around the laser irradiation portion of the target 1 as described above, products including carbon nanohorn aggregates produced in the production chamber 4 are transferred to the collection chamber 8 by a flow of atmospheric gas. In the production chamber 4, by introducing the gases from the inlet 6 disposed in the vicinity of the ZnSe window 5, it is possible to prevent the product from adhering to the ZnSe window 5.

In the sample collection container 12, an inert liquid may be sealed in the carbon nanohorn aggregate, and the collected carbon nanohorn aggregate can be collected by immersion in the liquid. The inert liquid can be selected as appropriate, but since the product is hydrophobic, an organic solvent is suitable, and for example, ethanol, isopropyl alcohol, or the like can be mentioned.

The altered region shown in FIG. 2(c) tends to be wider as the energy density of the laser is higher, the moving speed of the laser irradiation position is slower, and the thermal conductivity of the target is higher.

For laser ablation, $CO_2$ laser, excimer laser, YAG laser, semiconductor laser, etc., can be appropriately used as long as the target can be heated to a high temperature. $CO_2$ laser whose output can be easily increased is most suitable. The output of the $CO_2$ laser can be appropriately utilized, but preferably an output of 1.0 kW to 10 kW, and more preferably an output of 2.0 kW to 5.0 kW. If it is smaller than this range, since almost the target does not evaporate, undesirable from the viewpoint of the amount produced. If it is greater than this range, it is undesirable because the impurities such as graphite and amorphous carbon increases. In addition, the laser can be performed with continuous irradiation and pulse irradiation. For mass production, continuous irradiation is preferred.

The spot diameter of the laser beam can be selected from a range in which the irradiated area is about 0.02 $cm^2$ to 2 $cm^2$, that is, a range of 0.5 mm to 5 mm. Here, the irradiation area can be controlled by the laser output and the degree of condensation at the lens. Note that this spot diameter typically means a diameter in a spot (circle) when a laser beam is irradiated perpendicularly to a target surface forming a plane. When the surface of the target is not a plane surface or when the target surface is inclined as shown in FIG. 1, the shape of the spot is not a circle, but, for example, is substantially an ellipse, whose minor axis passing through the spot center of the laser beam is substantially equal to the diameter of the circle.

Pressure in the production chamber can be used at 13,332.2 hPa (10,000 Torr) or less, but the closer the pressure is to the vacuum, the more easily carbon nanotubes are formed and carbon nanohorn aggregates are not obtained. Preferably at 666.61 hPa (500 Torr) to 1,266.56 hPa (950 Torr), more preferably used in the vicinity of normal pressure (1,013 hPa (1 atm 760 Torr)) is also suitable for mass synthesis and cost reduction.

The production chamber can be set to any temperature, preferably 0 to 100° C., more preferably used at room temperature is also suitable for mass synthesis and cost reduction.

In the production chamber, the above atmosphere is made by introducing nitrogen gas and a noble gas alone or mixed. These gases can flow from the production chamber to the collection chamber and the material produced can be recovered by this gas flow. It may also be a closed atmosphere by the gas introduced. A flow rate of the atmospheric gas can be used any amount, preferably the flow rate in the range of 0.5 L/min to 100 L/min is appropriate. In the process of evaporation of the target, the gas flow rate is controlled to be constant. To constant gas flow rate can be performed by matching the supply gas flow rate and the exhaust gas flow rate. When performed near atmospheric pressure, it can be performed by exhausting by extruding the gas in the production chamber with the supply gas.

Depending on the amount of catalyst contained in the carbon target, the amount of formation of CNB changes. Although appropriately selected with respect to the amount of catalyst, the amount of catalyst is preferably 0.3 to 20 atomic % (at. %), more preferably 0.5 to 3 at. %. When the amount of catalyst is less than 0.3 at. %, the fibrous carbon nanohorn aggregate becomes very small. Further, when it exceeds 20 at. %, it is not appropriate because the cost increases because the amount of catalyst increases. For the catalyst, Fe, Ni, Co can be used alone, or by mixing. Among them, it is preferable to use Fe (iron) alone, it is particularly preferable in terms of the amount of production of CNB to use a carbon target containing 1 at. % or more 3 at. % or less of iron.

As described above, the formation of CNB is affected by physical properties (thermal conductivity, density, hardness, etc.) of the carbon target containing a catalyst and the content of the catalyst. The catalyst-containing carbon target having low thermal conductivity and low density, and being soft is preferred. That is, the second example embodiment of the present invention is characterized by using a catalyst-containing carbon target having 1.6 $g/cm^3$ or less of the bulk density and 15 W/(m·K) or less of the thermal conductivity. By making bulk density and thermal conductivity in these ranges, it is possible to increase the formation rate of CNB. When bulk density and thermal conductivity exceed these values, the formation rate of CNHs and other carbon structures increases, and the formation of CNBs may be almost eliminated. By using such a target, the energy given from the laser causes the target to evaporate instantaneously to form a dense space in which carbon and catalyst form, and the carbon released from the target is gradually cooled under atmospheric pressure environment to produce CNB.

Bulk density and thermal conductivity can be set a desired value by adjusting the molding pressure and the molding temperature when producing the amount and target of the catalyst metal.

Second Example Embodiment

The present example embodiment relates to another configuration of the CNB production apparatus. In the present example embodiment, the same components as those of the CNB production apparatus described in the first example embodiment are denoted by the same reference numerals, and description thereof is omitted as appropriate.

Figure 3A:
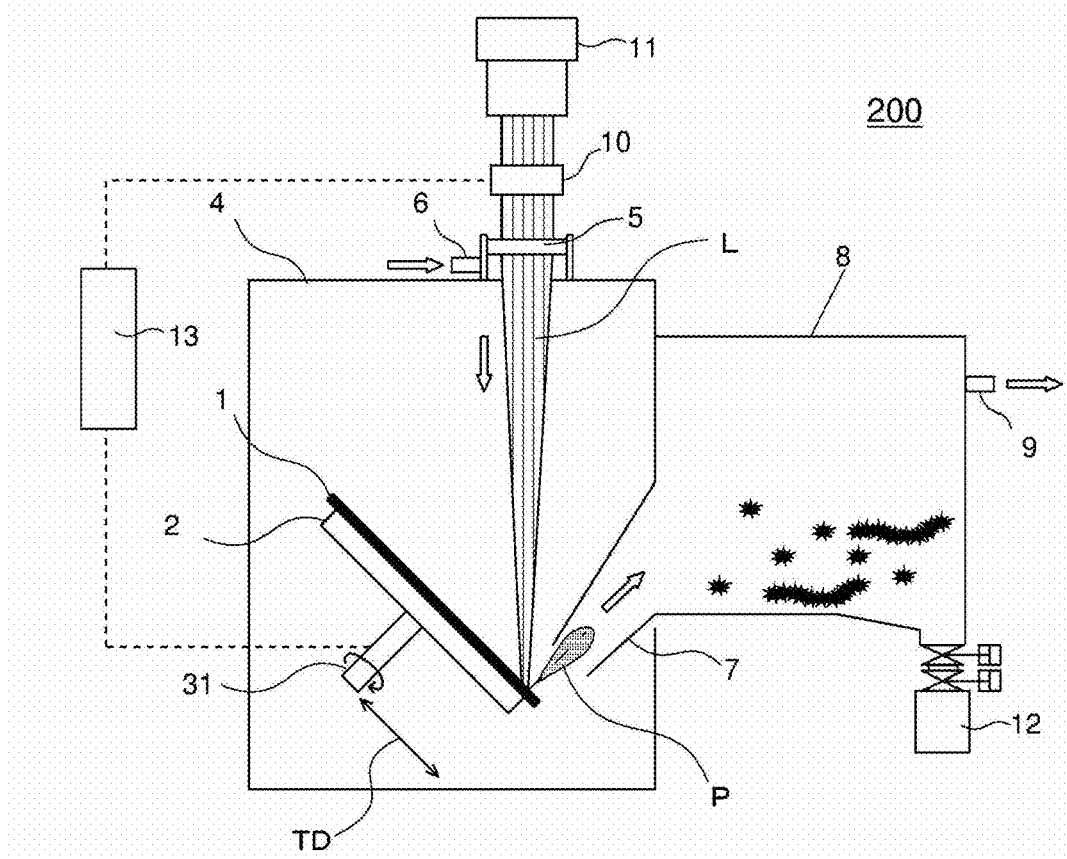
FIGS. 3(a)-3(c) are schematic side view of a CNB production apparatus according to an example embodiment of the present invention.
Figure 3B:
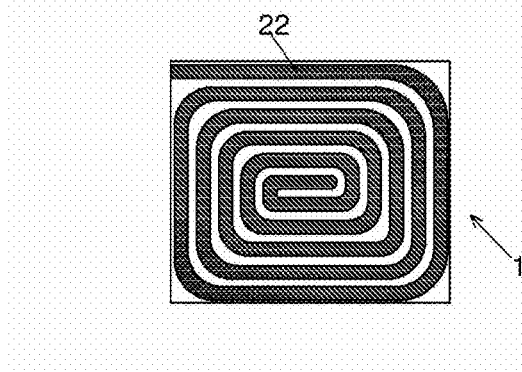
Figure 3C:
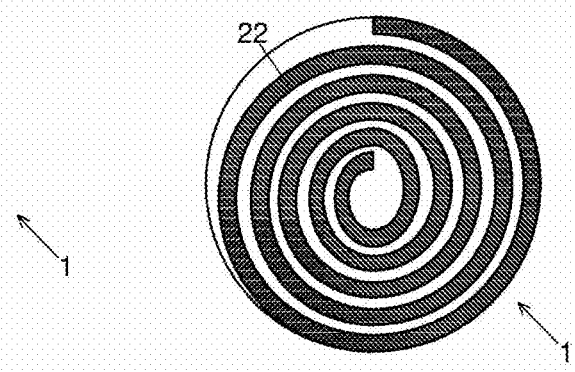

FIG. 3(a) is a side view showing the configuration of the CNB production apparatus 200 according to the present embodiment. The CNB production apparatus shown in FIG. 3(a) is characterized in that the carbon target 1 is rotated and the irradiation position of the laser beam L is moved in the parallel direction, whereby the control unit 13 controls the irradiation position to move spirally on the target as shown in FIGS. 3(b) and 3(c). The rotation shaft 31 is connected to a rotation mechanism (not shown), and has a moving means for moving the rotation mechanism in the moving direction TD in FIG. 3(a).

In the present embodiment as well, similarly to the configuration described with reference to FIGS. 2(a)-2(c) in the first example embodiment, the power density of the laser beam L irradiated on the surface of the carbon target 1 becomes substantially constant, and the irradiation position of the laser beam is moved to a region adjacent to the region irradiated with the laser beam first with irradiation at intervals of not less than the width of the altered region formed around the laser beam irradiation region.

Although embodiments of the present invention have been described above with reference to the drawings, these are examples of the present invention, and various configurations other than the above may be adopted.

EXAMPLES

The following examples illustrate the present invention in more detail. Of course, the present invention is not limited by the following examples.

Experimental Example 1

A sheet-like carbon target (bulk density of about 1.4 $g/cm^3$, thermal conductivity of about 5 W/(m·K)) containing 1 at. % of iron was installed in the target holder in the production chamber. The inside of the chamber was set to a nitrogen atmosphere. The carbon target was continuously irradiated with $CO_2$ gas laser beam for 5 minutes while moving the carbon target at a velocity of about 10 cm/min. The laser power was 3.2 kW, the spot diameter was 1.5 mm, and the irradiation angle was adjusted to be about 45 degrees at the center of the spot. The flow rate of the nitrogen gas was controlled to be 10 L/min and 700 to 950 Torr. The temperature in the reaction chamber was room temperature. As a result, the deposited amount of carbon evaporated was about 1 g.

FIG. 4 is a TEM image of the obtained sample. Fibrous and spherical structures were observed. FIG. 5 is a TEM image. The fibrous and spherical structures were found to be CNB and CNHs, respectively. CNB was found to have single-walled carbon nanohoms with a diameter of 1-5 nm and a length of about 40-50 nm assembled into fibers. The CNB itself had a diameter of about 30 to 100 nm and a length of several μm to several tens of μm. The black linear structure (arrow α) seen in the CNB is a structure when the graphene sheet (petal) is viewed from its end. The black particles (arrow β) are Fe.

DESCRIPTION OF REFERENCES

1. Catalyst-containing Carbon Target
2. Target Holding Unit
3. Movement Unit
4. Production Chamber
5. Irradiation Window
6. Gas Inlet
7. Transfer Pipe
8. Collection Chamber
9. Exhaust Port
10. ZnSe Plano-convex Lens
11. Laser Beam Source
12. Sample Collection Container
13. Control Unit
21. Irradiation Position
22. Irradiated Area
23. Altered Region
24. Width of the altered region
31. Rotating Shaft
100, 200. CNB Production Apparatus

The invention claimed is:

1. A production apparatus for manufacturing carbon nanohorn aggregates including a fibrous carbon nanohorn aggregate, the apparatus comprising:
a production chamber configured to receive a laser beam for irradiating a carbon target in sheet form containing a metal catalyst selected from a single body of Fe, Ni, Co or a mixture of these two or three of them in and atmosphere of non-oxidizing gas to produce a product including the fibrous carbon nanohorn aggregate;
a target holding unit configured to hold the carbon target inside the production chamber;
a light source configured to emit the laser beam onto a surface of the carbon target;
a laser focal position adjustment mechanism configured to introduce the laser beam emitted from the light source into the production chamber;
a movement unit configured to move the carbon target held by the target holding unit for moving the laser beam irradiation position on the surface of the carbon target;
a collection chamber connected to the production chamber via a transfer pipe and configured to collect carbon vapor vaporized from the carbon target by irradiation with the laser beam;
a collection mechanism configured to collect product including the fibrous carbon nanohorn aggregate in the collecting chamber;
a gas inlet configured to introduce the gas that makes the generation chamber a non-oxidizing gas atmosphere; and
an exhaust port configured to exhaust the ambient gas in the collection chamber; and
a control unit configured to control an operation of the movement unit or the light source so that the power density of the laser beam irradiated to the surface of the carbon target is substantially constant, and the irradiation position of the laser beam is moved to a region adjacent to a region previously irradiated by the laser beam, an interval being formed therebetween that is equal to or larger than the width of an altered region formed on the periphery of the region irradiated by the laser beam;
wherein the gas inlet is located adjacent to the laser focal position adjustment mechanism, and
the control unit is configured to match the gas flow rate introduced from the gas inlet to the gas flow rate exhausted from the exhaust port to provide a constant gas flow rate in the production chamber.

2. The production apparatus according to claim 1, wherein the movement unit is configured to move the irradiation position of the laser beam while keeping the irradiation angle of the laser beam at the irradiation position on the surface of the carbon target substantially constant.

3. The production apparatus according to claim 1, wherein the movement unit is configured to move the irradiation position of the laser beam from one end of the target to the other end in a row, and move the laser beam to the next row at intervals equal to or larger than the width of the altered region formed around the irradiation region formed by the irradiation.

4. The production apparatus according to claim 1, wherein the carbon target is a single sheet-like target, and the movement unit is controlled by the control unit so as to move the target in a spiral shape on the target by rotating and driving the target and moving the irradiation position from the outer periphery of the target toward the inner portion or in the opposite direction.

5. The production apparatus according to claim 1, wherein the moving speed of the laser beam irradiation position is in the range of 3 cm/min to 50 cm/min.

6. The production apparatus according to claim 5, wherein the output of the laser beam is in the range of 2.0 kW to 10 kW.

7. The production apparatus according to claim 1, wherein the collection mechanism comprises a collection container containing a liquid inert to the carbon nanohorn aggregate, and suspends and recovers the carbon nanohorn aggregate produced in the liquid.

8. The production apparatus according to claim 1, wherein the catalyst is Fe.

* * * * *